United States Patent
Flanner et al.

[11] Patent Number: 6,165,910
[45] Date of Patent: *Dec. 26, 2000

[54] SELF-ALIGNED CONTACTS FOR SEMICONDUCTOR DEVICE

[75] Inventors: Janet M. Flanner, Union City; Linda N. Marquez, Fremont; Joel M. Cook, Pleasanton; Ian J. Morey, San Jose, all of Calif.

[73] Assignee: Lam Research Corporation, Fremont, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/998,954

[22] Filed: Dec. 29, 1997

[51] Int. Cl.$^7$ .................................................. H01L 21/00
[52] U.S. Cl. .......................... 438/743; 438/706; 438/707; 438/710; 438/714; 438/723; 438/729; 438/734; 438/735; 438/737
[58] Field of Search .................................... 438/706, 707, 438/710, 714, 723, 729, 734, 735, 737, 743

[56] References Cited

U.S. PATENT DOCUMENTS

| | | | |
|---|---|---|---|
| 4,412,902 | 11/1983 | Michikami et al. | 207/192.24 |
| 4,980,304 | 12/1990 | Chin et al. | 438/365 |
| 4,987,099 | 1/1991 | Flanner et al. | 438/620 |
| 5,155,331 | 10/1992 | Horiuchi et al. | 204/298.09 |
| 5,271,788 | 12/1993 | Haegawa et al. | 204/298.31 |
| 5,286,344 | 2/1994 | Blalock et al. | 438/723 |
| 5,286,667 | 2/1994 | Lin et al. | 438/253 |
| 5,374,332 | 12/1994 | Koyama et al. | 216/13 |
| 5,637,237 | 6/1997 | Oehrlein et al. | 216/67 |
| 5,643,394 | 7/1997 | Maydan et al. | 204/298.33 |
| 5,683,537 | 11/1997 | Ishii | 156/345 |
| 5,783,496 | 7/1998 | Flanner et al. | 438/743 |

FOREIGN PATENT DOCUMENTS

| | | | |
|---|---|---|---|
| 0797250A2 | 9/1997 | European Pat. Off. | H01L 21/768 |
| 0805485A2 | 11/1997 | European Pat. Off. | H01L 21/311 |

OTHER PUBLICATIONS

International Search Report, EPO, Mar. 23, 1999.

*Primary Examiner*—Rodney G. McDonald
*Attorney, Agent, or Firm*—Beyer Weaver & Thomas, LLP

[57] ABSTRACT

In a plasma processing chamber, a method for etching through a selected portion of an oxide layer of a wafer's layer stack to create a self-aligned contact opening is described. The wafer stack includes a substrate, a polysilicon layer disposed above the substrate, a nitride layer disposed above said polysilicon layer and the oxide layer disposed above the nitride layer. The method for etching includes etching through the oxide layer of the layer stack with a chemistry and a set of process parameters. The chemistry essentially includes $C_2HF_5$ and $CH_2F_2$ and the set of process parameters facilitate etching through the oxide layer without creating a spiked etch and etching the oxide layer through to the substrate without substantially damaging the nitride layer.

26 Claims, 6 Drawing Sheets

|  | PARAMETERS | BROAD RANGE | PREFERRED RANGE |
|---|---|---|---|
| FIRST ETCH STEP OF THE TWO ETCH STEP PROCESS | PRESSURE (mTorr) | Depends on feature size and nature of silicon dioxide |  |
|  | Top Electrode power (Watts) | 500-2,000 | 1,200-1,800 |
|  | Bottom rf bias power (Watts) | 500-2,000 | 1,200-2,000 |
|  | $CHF_3$ Flowrate (sccm) | 5-200 | 30-60 |
|  | $C_2HF_5$ Flowrate (sccm) | 5-50 | 5-40 |
|  | $CH_2F_2$ Flowrate (sccm) | 0-20 | 1 |
| SECOND ETCH STEP OF THE TWO ETCH STEP PROCESS OR SINGLE ETCH STEP PROCESS | PRESSURE (mTorr) | Less than or equal to 3 | 1-3 |
|  | Top Electrode power (Watts) | 500-2,000 | 1,200-1,800 |
|  | Bottom rf bias power (Watts) | 500-2,000 | 1,200-2,000 |
|  | $CHF_3$ Flowrate (sccm) | 0-10 | 0 |
|  | $C_2HF_5$ Flowrate (sccm) | 5-50 | 20-50 |
|  | $CH_2F_2$ Flowrate (sccm) | Depends on the shape of the features and contact hole aspect ratios | 10-50 |

FIG. 4

SELF-ALIGNED CONTACTS FOR SEMICONDUCTOR DEVICE

BACKGROUND OF THE INVENTION

The present invention relates to the fabrication of semiconductor integrated circuits (IC's). More particularly, the present invention relates to methods and apparatuses for etching through an IC's layer stack, including an oxide layer, during IC fabrication to create self-aligned contact openings.

In the manufacture of certain semiconductor integrated devices such as metal oxide semiconductor (MOS) transistors, self-aligned contacts offer many advantages. To facilitate discussion, FIGS. 1A and 1B illustrate cross-sectional views of the relevant portion of a layer stack 20, representing the layers formed during the fabrication of a typical semiconductor IC that employs self-aligned contacts. It should be noted that other additional layers above, below, or between the layers shown may be present. Consequently, as the term is used herein, relative positional terms such as "over" or "above" do not necessarily indicate a direct contact between the layers under discussion. Further, not all of the shown layers need necessarily be present and some or all may be substituted by other different layers.

Referring initially to FIG. 1A, there is shown a substrate 22 at the bottom of layer stack 20 (not drawn to scale for ease of illustration). Substrate 22 represents a semiconductor wafer, which is typically formed of silicon. An oxide layer 26, typically comprising $SiO_2$, is formed above wafer 100 to serve as the gate oxide layer. Above this gate oxide layer 26, there are disposed respective polysilicon gates 28 and 30. Each of these polysilicon gates 28 and 30 is protected by a nitride region of a subsequently deposited nitride layer ($Si_3N_4$ or $Si_xN_y$ generally). In FIG. 1A, these nitride regions are shown as nitride regions 32 and 34. Above the gate oxide regions, the polysilicon gates, and the protective nitride regions, there is disposed an oxide layer 40.

To create a contact opening 44 to substrate 22 through oxide layer 40, a layer of photoresist material 42 is deposited and patterned using a conventional photolithography step. After patterning, an initial opening is created in photoresist layer 42 to facilitate subsequent oxide etching. The above-described layers and features, as well as the processes involved in their creation, are well known to those skilled in the art.

FIG. 1B shows the same layer stack 20 of FIG. 1A and its layers. In FIG. 1B, however, a contact opening 44 has been etched through oxide layer 40. Through this contact opening 44, a metal conductor may be formed subsequently to contact the drain and source regions in substrate 22. In the present case, contact opening 44 represents a self-aligned contact, i.e., it performs its contacting function irrespective of whether the sidewalls of the contact opening overlap all or part of the gate stack comprising the gate oxide region, the polysilicon gate, and the protective nitride layer. Since the polysilicon gates themselves are protected by the overlaying nitride material, some misalignment between region D1 between the gate stacks and contact opening 44 may be present without shorting the gate of the resulting transistor to its drain and source. By way of example, sidewall 50 of contact opening 44 is shown overlapping polysilicon gate 28. Nevertheless, the presence of nitride region 32 electrically insulates polysilicon gate 28 from the conductive contact material subsequently deposited into contact opening 44.

The use of self-aligned contacts advantageously permits circuit designers greater flexibility in the placement of the contact openings. In some instances, the use of self-aligned contacts permits circuit designers to pack the gates more closely together since the minimal distance between the gates is not bounded by the dimension of the contact opening (which is limited by, for example, the accuracy of the photolithography and the oxide etch processes).

As can be appreciated by those skilled in the art, the above-described self-aligned contact technique requires that the contact opening, e.g., contact opening 44 of FIG. 1B, be etched without damage to the insulating nitride regions that overlay the polysilicon gates. In other words, it is desirable to etch the contact opening with an oxide etch process that has a high oxide-to-nitride selectivity. In order to ensure an adequate contact area between the subsequently deposited metal layer and the wafer, it is desired that the etch profile be as close to the desired vertical profile as possible with little or no unetched oxide sticking to the nitride sidewall. It is also desirable when etching contact openings to improve the oxide etch rate in order to increase the wafer throughput rate. Additionally, it is also desirable to etch contact openings with a uniform etch rate across the wafer so that dies that are located in the center of the wafer are etched at the same rate as dies that are located at the wafer edge.

In view of the foregoing, what is desired is improved methods and apparatuses for etching self-aligned contacts. Among other advantages, the improved methods and apparatuses preferably maximize the oxide etch rate, the oxide-to-nitride selectivity, and etch uniformity, while improving the etch profile.

SUMMARY OF THE INVENTION

The invention relates, in one embodiment, to a method for etching through a selected portion of an oxide layer of a wafer's layer stack to create a self-aligned contact opening in a plasma processing chamber. The wafer stack includes a substrate, a polysilicon layer disposed above the substrate, a nitride layer disposed above the polysilicon layer, the oxide layer disposed above the nitride layer. The method for etching includes etching through the oxide layer of the layer stack with a chemistry and a set of process parameters, the chemistry essentially includes $C_2HF_5$ and $CH_2F_2$ and the set of process parameters facilitate etching through the oxide layer without creating a spiked etch and etching the oxide layer through to the substrate without substantially damaging the nitride layer.

In another embodiment, the present invention provides a method for etching through a selected portion of an oxide layer of a wafer's layer stack to create a self-aligned contact opening in a plasma processing chamber. The wafer stack includes a substrate, a polysilicon layer disposed above the substrate, a nitride layer disposed above the polysilicon layer and the oxide layer is disposed above the nitride layer. The method for etching, in this embodiment, includes a first etching step for etching partially through the oxide layer of the layer stack with a first chemistry and a first set of process parameters. The first chemistry essentially includes $CHF_3$ and $C_2HF_5$ and the first set of process parameters represents a set of parameters for etching through the oxide layer without creating a spiked etch. The method for etching further includes a second etching step for etching the oxide layer through to the substrate with a second chemistry including $C_2HF_5$ and $CH_2F_2$ and a second set of process parameters. The second set of process parameters are different from the first set of process parameters and represent a set of parameters for etching the oxide layer through to the substrate without substantially damaging the nitride layer.

BRIEF DESCRIPTION OF THE DRAWINGS

FIG. 4 is a table showing, in accordance with one embodiment of the present invention, the approximate preferred values for the process parameters of the single step etch process and for the first and second etching steps of the two step etch process.

DETAILED DESCRIPTION OF THE PREFERRED EMBODIMENTS

An invention is described for achieving, among others, improved oxide etch rate and oxide etch characteristics, e.g., oxide-to-nitride selectivity, etch uniformity, and etch profile during the etching of self-aligned contact openings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The present invention provides a method for etching through an oxide layer to effectively form self-aligned contacts without substantially damaging a protective nitride layer disposed above the gate electrode. Depending on the aspect ratio or depth of the of the self-aligned contact, etching according to the present invention may be performed in a single step using an appropriate chemistry and set of process parameters or may be performed in two steps, each of which may employ a different chemistry and a different set of process parameters. The term "aspect ratio," as used herein refers to the ratio of the depth of the contact opening to the width of the contact opening at the surface of the oxide layer.

Figure 1A:
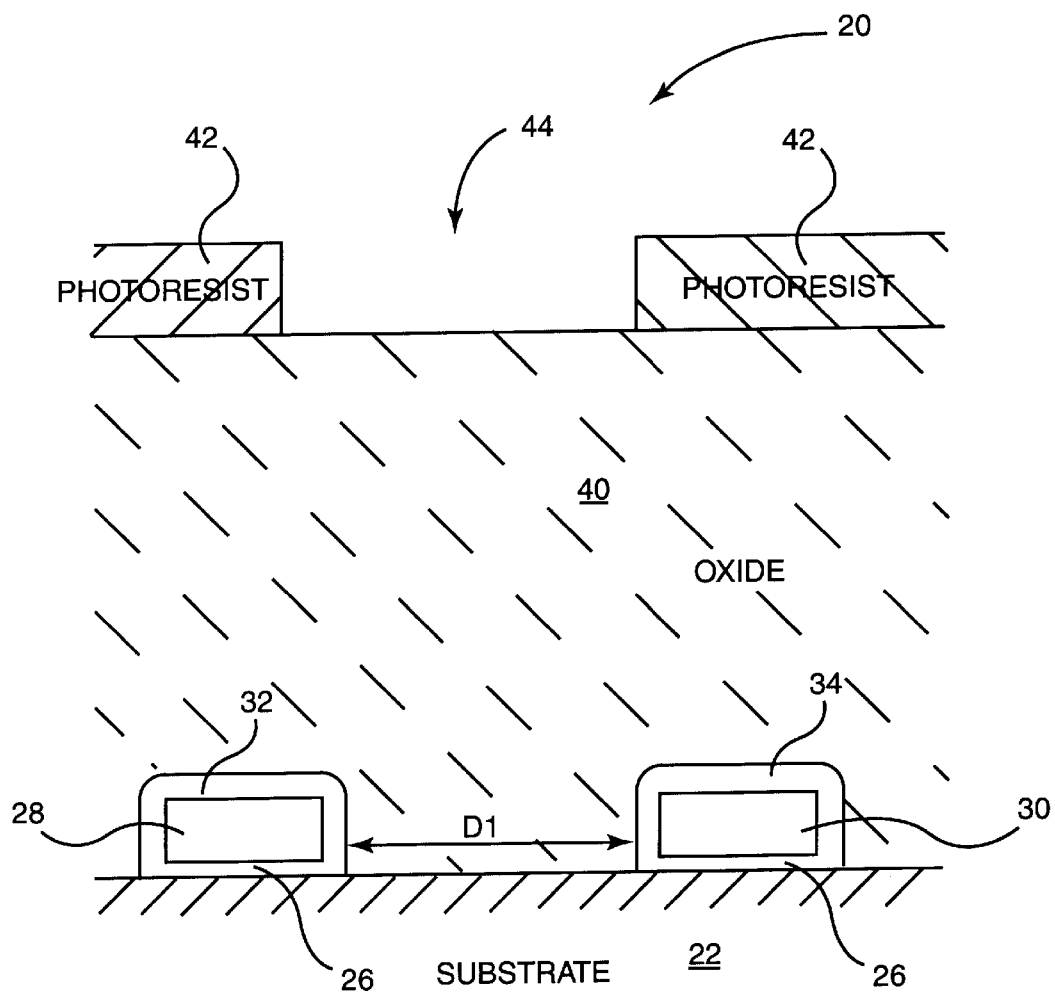
FIG. 1A illustrates a cross-sectional view of a layer stack, representing the layers formed during the fabrication of a typical semiconductor IC that employs self-aligned contacts.
Figure 1B:
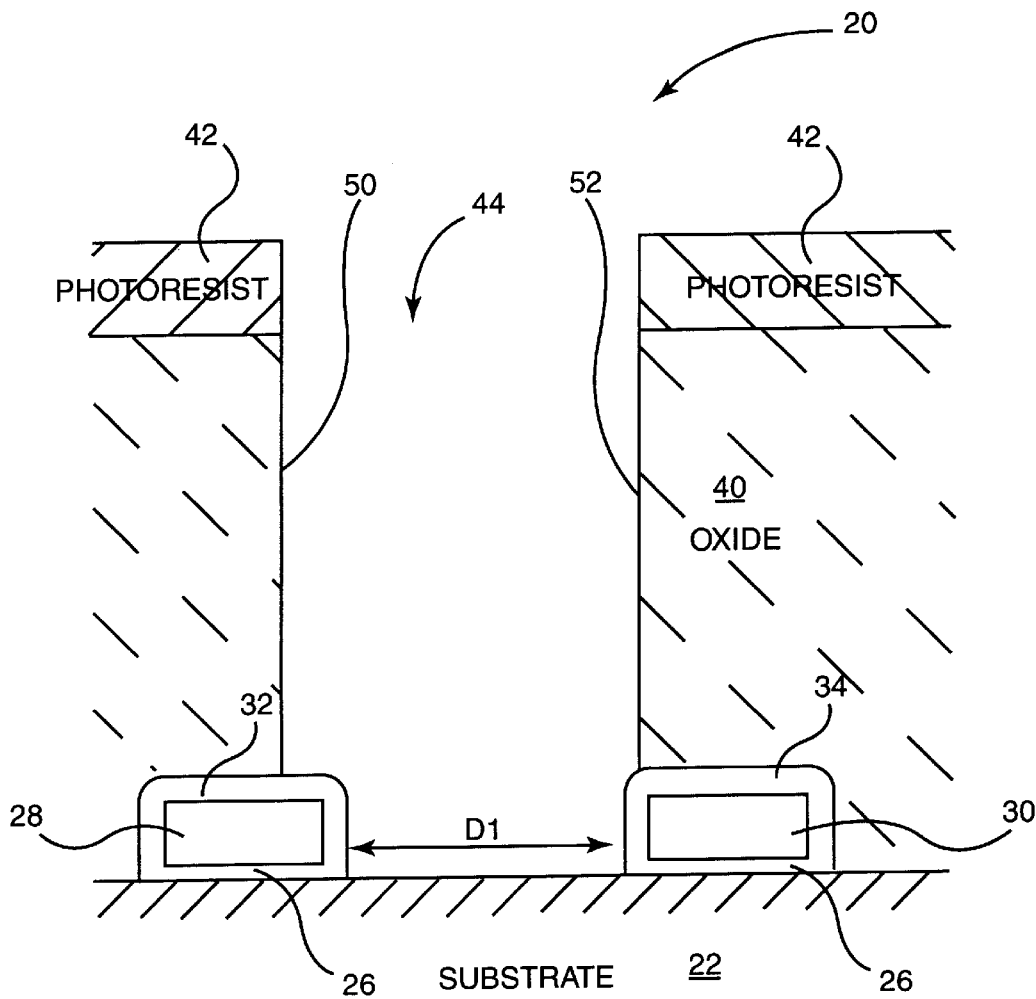
FIG. 1B shows the same layer stack of FIG. 1A after a self-aligned contact opening has been etched through to the oxide layer.

In accordance with one embodiment of the present invention, self-aligned contact openings having an aspect ratio of between about 1:1 and about 4:1 or a depth that is generally less than or equal to about 1 micrometer or preferably less than or equal to about 7500 Angstroms are formed in a single etch step. In this step, etching is carried out by employing a chemistry that includes $C_2HF_5$ and $CH_2F_2$ and a set of process parameters that facilitate etching through the oxide layer without creating a spiked etch, which is explained below. In this embodiment, a top plane of the protective nitride layer, e.g. layers 32 and 34 of FIGS. 1A and 1B, is generally disposed at most about 5000 Angstroms above the substrate surface and preferably disposed at most about 2500 Angstroms above the substrate surface.

Figure 2:
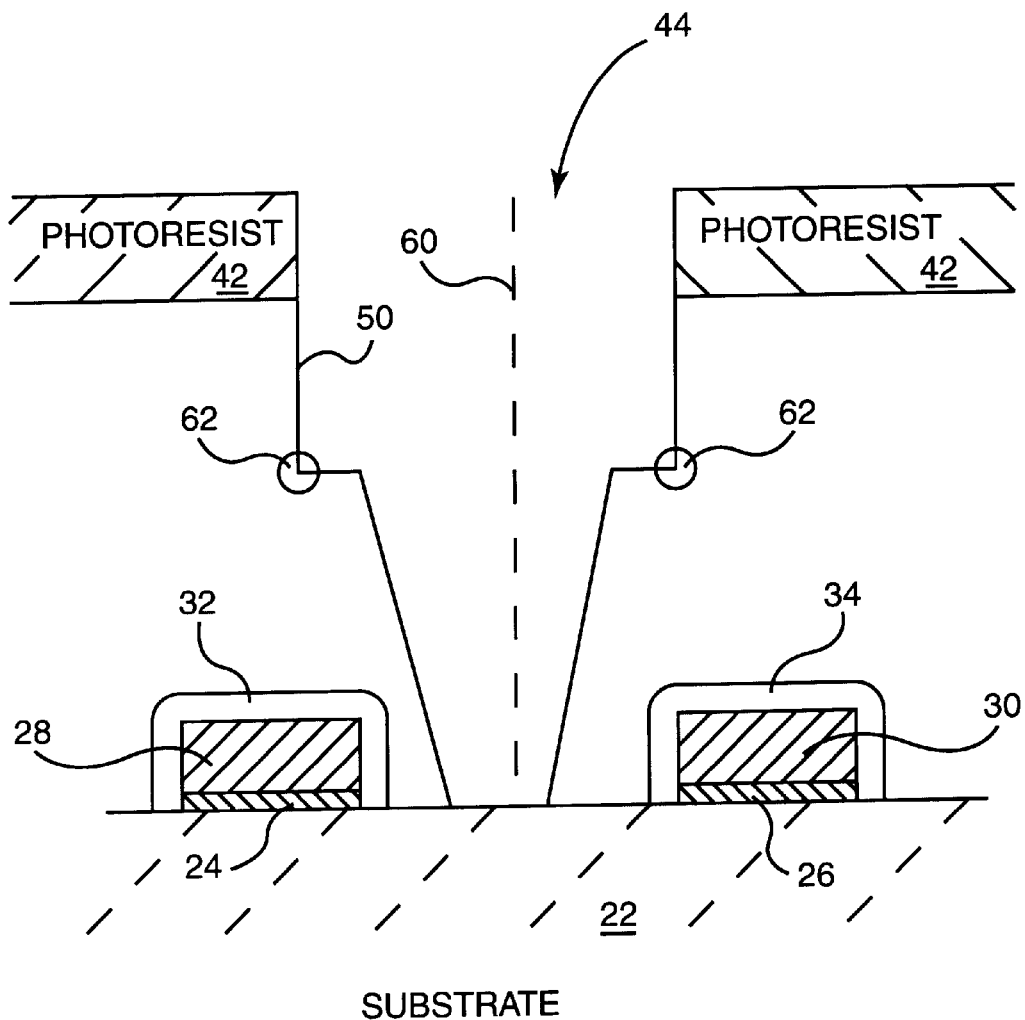
FIG. 2 illustrates a spiked etch that is formed on the sidewall of a self-aligned contact opening.

In accordance with another embodiment of the present invention, the self-aligned contact openings having an aspect ratio of equal to or greater than about 3:1 or a depth greater than about 0.75 micrometer are etched with a two-step etch process, which employs $CHF_3$, $C_2HF_5$, $CH_2F_2$ and optionally argon, $CF_4$ and/or $C_2F_6$ as etchant source gases in a plasma processing chamber. In the first etch step, the contact opening is preferably etched with a first chemistry that includes $CHF_3$ and $C_2HF_5$ and first set of process parameters that are designed to, among others, prevent the occurrence of a spiked etch. Furthermore, the first chemistry may preferably include argon, which further facilitates the prevention of a spiked etch and enhances photoresist selectivity. Further still, the first chemistry may also include $CF_4$ and/or $C_2F_6$ as etchant source gases in a plasma processing chamber. As the term is employed herein, a spiked etch represents a distortion in the etch sidewall such that the contact opening becomes progressively narrower at the bottom of the etch. As illustrated in FIG. 2, contact opening 44 is then to have a spiked etch when its sidewalls taper toward the contact opening center line 60 starting from a threshold position 62. In some cases, the critical dimension of the contact opening may narrow before the contact opening sidewalls begin to taper toward center line 60.

The second etch step is then performed with a second chemistry that includes $C_2HF_5$ and $CH_2F_2$ and a second set of process parameters that is optimized to increase, among others, the oxide-to-nitride selectivity. Furthermore, the second chemistry may also include $CF_4$ and/or $C_2F_6$ as etchant source gases in a plasma processing chamber. It is believed that the addition of $CF_4$ and $C_2F_6$ advantageously enhances the removal of oxide residues. As noted earlier, increased oxide-to-nitride selectivity advantageously reduces the chance, during the etching of the contact openings, of damaging the protective nitride regions that overlay the polysilicon gates.

The inventive single step and two-step self-aligned contact opening etch technique may be performed in any of the known plasma processing apparatuses, including those adapted for dry etching, plasma etching, reactive ion etching (RIE), magnetically enhanced reactive ion etching (MERIE), electron cyclotron resonance (ECR), or the like. To further elaborate, in a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma. ECR and TCP™ (transformer coupled plasma) processing systems, among others, are readily available commercially. TCP™ systems represent a class of high density plasma systems and are available from, for example, Lam Research Corporation of Fremont, Calif.

Figure 3:
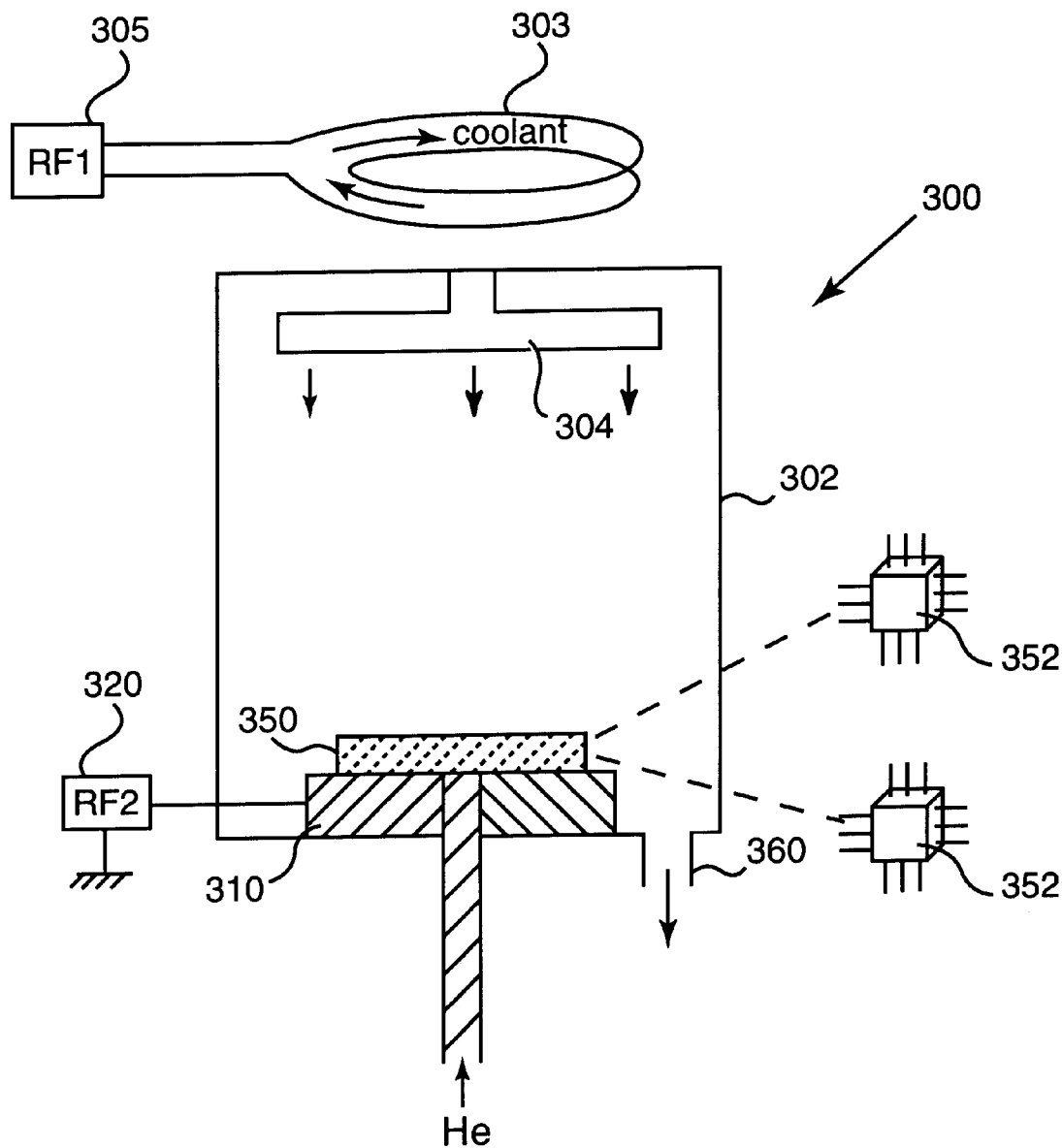
FIG. 3 is a simplified schematic diagram of a plasma reactor that may be suitably employed with the inventive two-step contact-opening etch technique.

In a preferred embodiment, the present invention is practiced in a modified TCP™ 9100 plasma reactor, which is available from Lam Research Corporation, although, as mentioned above, any conventional and suitable plasma processing systems may well be employed. FIG. 3 illustrates a simplified schematic of the modified TCP™ 9100 plasma reactor, including wafer 350 and integrated circuit chips 352, which are fabricated from dies cut from wafer 350 after the wafer is etched according to the inventive two-step self-aligned contact opening etch and processed in conventional post-etch steps. Referring to FIG. 3, a wafer reactor 300 includes a plasma processing chamber 302 preferably made from anodized aluminum. Above chamber 302, there is disposed an electrode 303, which is implemented by a coil in the example of FIG. 3. Coil 303 is energized by a RF generator 305 via a matching network (not shown in FIG. 3).

The modified design of plasma processing chamber 302 of FIG. 3 includes provisions (not shown to simplify illustration) for circulating a coolant, e.g., glycol or deionized water, inside coil 303 to control the temperature of coil 303. The etch produced by such a modified plasma processing systems is more reproducible relative to the etch produced by current unmodified plasma processing systems (which do not include provisions for a temperature control mechanism).

While intending not to be bound by theory, the lack of temperature control in unmodified plasma processing systems undesirably impacts oxide etch characteristics over time and suffers from poor reproducibility. It is believed that the temperature of shower head 304 (mentioned below) is also controlled by the temperature control mechanism mentioned above. It has been found that during oxide etching, a certain amount of polymer from the plasma generated in plasma processing chamber 302 condenses on the relatively cooler surface of shower head 304. When other etch chemistries (different from the present invention) and those chemistries known to those skilled in the art are employed to facilitate etching, there may be a polymer shortage at the wafer etch front. This polymer shortage is believed to disrupt the required well known balance between polymer formation and oxide etching that yields an etch characterized by a high oxide-to-nitride selectivity. As will be explained later, the chemistries of the present invention, however, provide optimum etch characteristics including high oxide-to-nitride selectivity in modified plasma processing systems.

Now referring back to FIG. 3, within chamber 302, there is typically provided a gas distribution plate or shower head 304, which preferably is made from silicon nitride and includes a plurality of holes for releasing gaseous source materials, e.g., the etchant source gases, into the RF-induced plasma region between shower head 304 and a wafer 350. The gaseous source materials may also be released from ports built into the walls of the chamber itself. Wafer or substrate 350 is introduced into chamber 302 and disposed on a chuck 310, which acts as a second electrode and is preferably biased by a radio frequency generator 320 (also typically via a matching network). Chuck 310 also includes a focus ring (not shown to simplify illustration), preferably made from silicon nitride or silicon nitride and silicon carbide, positioned at a bottom electrode. Wafer 350 may be secured to chuck 320 using an electrostatic clamp.

Helium cooling gas is introduced under pressure (e.g., about 20 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low by withdrawing gas through port 360, e.g., between slightly above 0 mTorr to about 20 mTorr during contact opening etching. A plurality of heaters (omitted from FIG. 3 to simplify the illustration) may be provided to maintain a suitable chamber temperature for etching. To provide an electrical path to ground, the chamber wall of chamber 302 is typically grounded.

It is important to note that the modified plasma processing system above increases the reproducibility of an etch as mentioned above. Furthermore, the use of silicon nitride in manufacturing the focus ring and shower head is believed to reduce contamination of the metal plug composition of the wafer. The chemistries and process parameters of the present invention optimize oxide-etch characteristics in these modified plasma processing systems. The term "optimize," as used herein means that the oxide etch rate is balanced against the oxide-to-nitride selectivity to provide optimum or acceptable values for both the oxide etch rate and oxide-to-nitride selectivity. Of course, those skilled in the art will recognize that there is always a tradeoff in oxide etching, i.e., high oxide etch rate may be realized at the expense of poor oxide-to-nitride selectivity and high oxide-to-nitride selectivity may be realized at the expense of poor oxide etch rates. The chemistries and process parameters of the present invention provide optimum or acceptable values for both the oxide etch rate and the oxide-to-nitride selectivity.

As mentioned above, when a single etch step process is employed, e.g., for self-aligned contacts having aspect ratios of between about 1:1 and 4:1, or relatively shallow features, e.g. depth that is less than or equal to about 1 micrometer, a single set of process parameters and chemistry may be effective to yield a high oxide-to-nitride selectivity. In those instances where the two step etch process is preferred, e.g., for self-aligned contacts having aspect ratios of equal to or greater than 3:1 or depth greater than about 0.75 micrometer, various process parameters may be varied between the first etching step and the second etching step. The first etch step in the two step etch process is designed to have a lower oxide-to-nitride selectivity then the second etch step. Furthermore, the chemistries and process parameters of the single etch step process are substantially similar to the second etch step of the two step etch process. It should be borne in mind that although the two step etch process may be employed to form contact openings that could be formed with a single etch step process, it is, however, preferable to use the two step etch process for contact openings of equal to or greater than 3:1 or depth greater than about 0.75 micrometer.

In the two step etch process, the chemistry and process parameters change from the first etch step to the second etch step. Consequently, it should be understood from the description below that more than one or all of the process parameters mentioned may be changed as the etch proceeds from the first etching step to the second etching step in the two step etch process.

FIG. 4 shows the various process parameters and their approximate values employed during etching, according to the present invention. It should be borne in mind that the values shown in FIG. 4 are obtained when a 8" silicon wafer undergoes etching. By way of example, the pressure of the etchant source gas in the first etch step generally depends on the feature size, e.g., the width of the contact opening, and the nature of oxide being etched, e.g., oxide deposited by TEOS (tetraethyl orthosilicate), BPSG (borophosphosilicate glass) oxide, etc. The pressure in the first etch step may preferably range from between about 2 mTorr and about 15 mTorr. The pressure in the second etch step may generally be less than or equal to about 3 mTorr and preferably be between about 1 mTorr and about 3 mTorr.

In one aspect of the present invention, the flow rate of $CH_2F_2$ is advantageously increased from the first etching step to the second etching step or $CH_2F_2$ is absent during the first etch step, but introduced into the plasma processing chamber to facilitate the second etch step. It is believed that the increased flows of $CH_2F_2$ gas advantageously enhances the selectivity of the oxide to the nitride and the substrate. The flow rate of $CH_2F_2$ in the second etch step of the two step etch process or in the single etch step process generally depends on the shapes of the features, e.g., degree of roundedness of corners of the protective nitride layer above the gate, thickness of the protective nitride layer and oxide layer, and shape and size of contact hole. In the second etch step, the flow rate of $CH_2F_2$ preferably ranges from between about 10 and about 50 sccm.

In accordance with one aspect of the invention, the first etching step of the two step etch process is preferably permitted to continue as far down into the oxide layer as possible without damaging the protective nitride layer. This is because the first etching step is optimized to minimize the possibility of a spiked etch while achieving commercially advantageous etch rate, uniformity, and etch rate loading values.

In one embodiment, the first etching step is terminated when it reaches a predefined location above the plane formed by the top of the protective nitride features (herein "top-of-nitride-layer plane"), e.g., the plane formed by the top of nitride layers 32 and 34 of FIG. 1A. The predefined location where this first etching step terminates is preferably in the range between about the top-of-nitride-layer plane and about 1,000 angstroms above this top-of-nitride-layer plane. More preferably, the predefined location is in the range between about the top-of-nitride-layer plane and about 250 angstroms above this top-of-nitride-layer plane. Even more preferably, the predefined location is about even with the top-of-nitride-layer plane.

Note that for contact openings formed by the two step etch process, while a higher oxide-to-nitride selectivity may cause a spiked etch if employed in the first etching step, the fact that the second etching step has a higher oxide-to-nitride selectivity does not necessarily mean that a poor quality self-aligned contact opening will result. This is because the self-aligned contact opening is etched first with a chemistry and set of process parameters that have a lower oxide-to-nitride selectivity and is not etched with the higher oxide-to-nitride selectivity chemistry and recipe until the etch has advanced fairly deeply into the oxide layer to just above the protective nitride layer. If any spiked etch is formed by this higher selectivity chemistry and recipe, it does not have a chance to start until the contact opening is nearly etched through between the gates and its effect on the etch profile would therefore be minimal. As can be appreciated by those skilled in the art, this aspect of the invention tends to improve the chance that the contact etch profile would be more vertical and have less unetched oxide residues clinging to the nitride sidewalls (due to the high selectivity second etching step) while reducing incidents of spiked etch. Of course, in the case of contact openings that have relatively lower aspect ratios and are relatively shallow, the single step etch chemistry and recipe of the present invention is not deep enough into the oxide layer to form the aforementioned spike.

Table 1 below shows the approximate process results obtained from the experiment of FIG. 4. As can be shown in Table 1, the inventive etch process results in highly advantageous etch rates, uniformity, and oxide-to-nitride selectivity. Further, damage to the protective nitride layer that overlays the polysilicon gates was observed to be minimal. The etch profile within the contact opening was observed to be relatively free of grass, i.e., the oxide residue that is often left behind after etching due to nonuniformity in the deposition of the oxide material.

TABLE 1

| PARAMETER | PROCESS RESULTS | |
| --- | --- | --- |
| | First Etch Step | Second Etch/ Single Etch Step |
| Etch Rate (Angstroms/min) | 11,500 | 10,000-13,500 |
| Uniformity (1 σ) | 5% | 5% |
| Oxide-to-Nitride Selectivity | 1 to 10:1 | 20 to 30:1 |

It will be apparent to those skilled in the art in light of this disclosure to modify the values disclosed herein as appropriate to etch in other plasma etching systems, to etch wafers and substrates having other dimensions.

Figure 5:
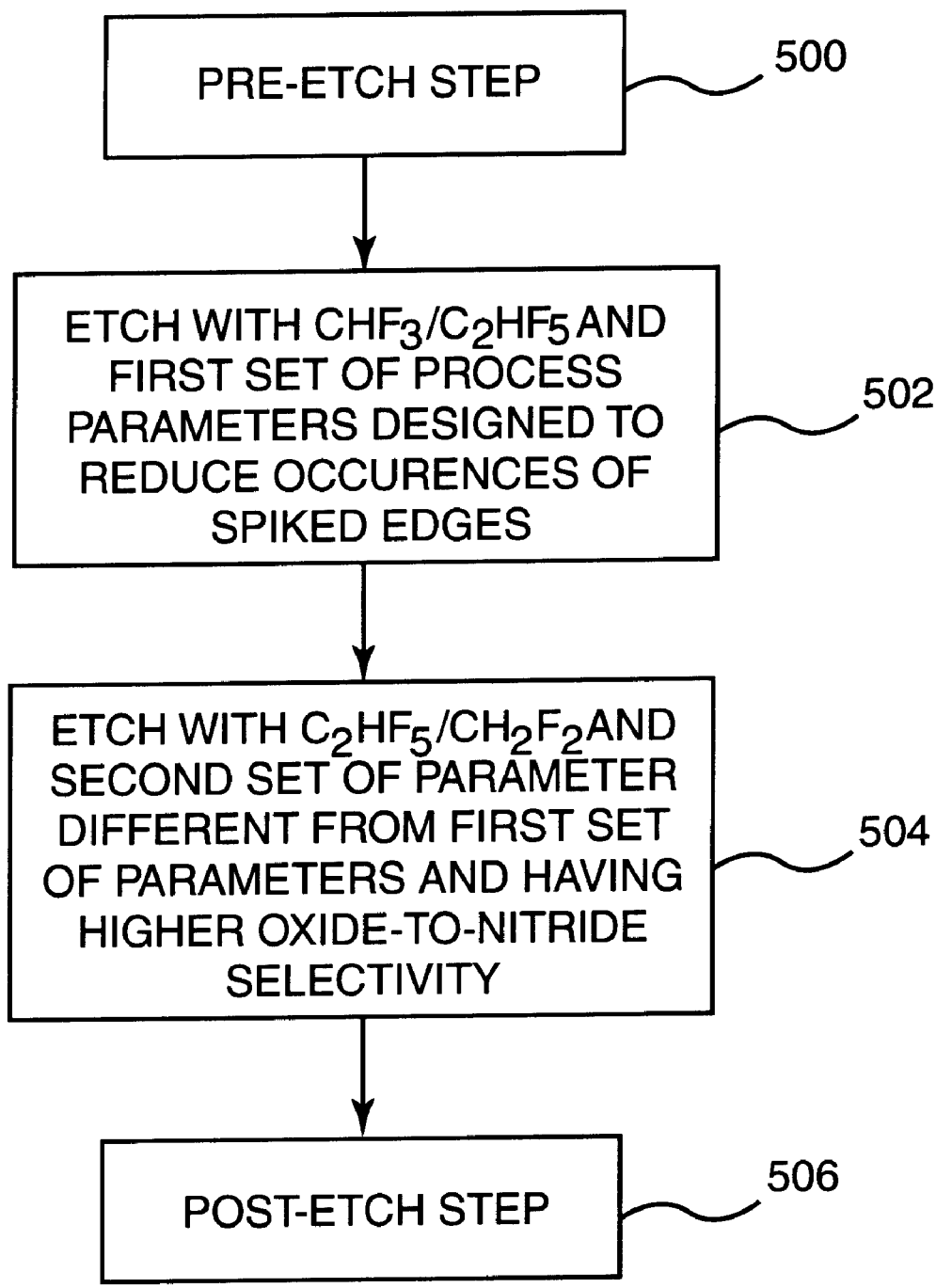
FIG. 5 shows, in accordance with one aspect of the present invention, the steps involved in the inventive two-step self-aligned contact opening etch process.

FIG. 5 shows, in accordance with one aspect of the present invention, the steps involved in the inventive two-step self-aligned contact opening etch process. In step 500, a wafer is prepared for etching in a conventional pre-etch step. The pre-etch step may include, for example, depositing and patterning the photoresist layer on the wafer, securing the wafer onto the chuck, stabilizing the pressure within the plasma processing chamber, and introducing helium cooling gas to the wafer backside to facilitate heat transfer between the wafer and the chuck.

In the first etch step 502, the oxide layer, e.g., oxide layer 40 of FIG. 1A, is etched using a first set of process parameters and a first chemistry including $CHF_3$ and $C_2HF_5$. The first set of process parameters facilitate etching through the oxide layer without creating a spiked etch. Preferably but not necessarily, the first etch step 502 is performed at a chamber etch pressure that is higher than the chamber etch pressure employed in a subsequent second etch step. The higher chamber etch pressure is believed to reduce the likelihood of a spiked etch. As noted, the first etch step is allowed to advance into the oxide layer as far as possible without causing damage to the protective nitride layer that overlays the polysilicon features.

In the second etch step 504, oxide etching continues in the presence of a second set of process parameters and chemistry including $C_2HF_5$ and $CH_2F_2$. This second etching step preferably proceeds until the self-aligned contact opening is etched through to the underlying substrate. The use of a high oxide-to-nitride selectivity recipe and chemistry in this second etching step advantageously minimizes damage to the protective nitride layer and ensures the substantial removal of oxide from the contact hole, including oxide residue on the nitride sidewalls. In this manner, the first etching step does not have to suffer the adverse consequences typically associated with a high selectivity recipe, e.g., the increased likelihood of a spiked etch.

In step 504, the wafer may undergo additional processing steps to fabricate the desired components as well as post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers. As mentioned before, the single etch step process is substantially similar to step 504 of FIG. 5.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching through a selected portion of an oxide layer of a wafer's layer stack to create a self-aligned contact opening, said wafer stack comprising a substrate, a polysilicon layer disposed above said substrate, a nitride layer disposed above said polysilicon layer, said oxide layer being disposed above said nitride layer, said method comprising:

etching through said oxide layer of said layer stack with a chemistry and a set of process parameters, said chemistry comprising $C_2HF_5$ and $CH_2F_2$, said set of process parameters facilitate etching through said oxide layer without creating a spiked etch and etching said oxide layer through to said substrate without substantially damaging said nitride layer.

2. The method of claim 1, wherein the self-aligned contact opening has an aspect ratio of between about 1:1 and about 4:1.

3. The method of claim 1, wherein the self-aligned contact opening has a depth that is less than or equal to about 1 micron.

4. The method of claim 3, wherein the self-aligned contact opening has a depth that is less than or equal to about 7500 Angstroms.

5. The method of claim 3, wherein a top plane of the nitride layer is disposed at most about 5000 Angstroms above the substrate.

6. The method of claim 5, wherein the top plane of the nitride layer is disposed at most about 2500 Angstroms above the substrate.

7. The method of claim 1, wherein the plasma processing chamber is a transformer coupled plasma etch system, which strikes a plasma by inductive coupling action of a top electrode.

8. The method of claim 7, wherein the temperature of the top electrode is controlled by circulating a coolant through the top electrode.

9. The method of claim 1, wherein an interior of the plasma processing chamber is made from anodized aluminum.

10. The method of claim 1, wherein the gas distribution plate is made from silicon nitride.

11. The method of claim 1, wherein the chemistry includes at least one of $CF_4$, $C_2F_6$ and argon.

12. The method of claim 11, wherein a bottom electrode of the plasma chamber includes a focus ring that is made from one of silicon nitride and silicon carbide.

13. The method of claim 11, wherein the substrate is secured above a bottom electrode using an electrostatic clamp.

14. In a plasma processing chamber, a method for etching through a selected portion of an oxide layer of a wafer's layer stack to create a self-aligned contact opening, said wafer stack comprising a substrate, a polysilicon layer disposed above said substrate, a nitride layer disposed above said polysilicon layer, said oxide layer being disposed above said nitride layer, said method comprising:

a first etching step for etching partially through said oxide layer of said layer stack with a first chemistry and a first set of process parameters, said first chemistry consisting essentially of $CHF_3$ and $C_2HF_5$, said first set of process parameters represents a set of parameters for etching through said oxide layer without creating a spiked etch; and a second etching step for etching said oxide layer through to said substrate with a second chemistry consisting essentially of $C_2HF_5$ and $CH_2F_2$ and a second set of process parameters, said second set of process parameters being different from said first set of process parameters and representing a set of parameters for etching said oxide layer through to said substrate without substantially damaging said nitride layer.

15. The method of claim 14, wherein said second chemistry further includes at least one of $CF_4$, $C_2F_6$ and argon.

16. The method of claim 14, wherein the plasma processing chamber strikes a plasma using a top electrode and a temperature of the top electrode is controlled by circulating a coolant through the top electrode.

17. The method of claim 14, wherein said first set of process parameters results in a lower oxide-to-nitride selectivity in said first etching step than an oxide-to-nitride selectivity achieved in said second etching step using said second process parameters.

18. The method of claim 14, wherein said first etching step terminates upon reaching a predefined position, said predefined position being in the range of about 1,000 angstroms above a plane defined by a top surface of said nitride layer to a position that substantially equals a midpoint of said nitride layer.

19. The method of claim 18, wherein said first etching step terminates upon reaching a predefined position, said predefined position being in the range of about 250 angstroms above a plane defined by a top surface of said nitride layer to a position that substantially equals a midpoint of said nitride layer.

20. The method of claim 19, wherein said first etching step terminates upon substantially reaching a plane defined by a top surface of said nitride layer.

21. The method of claim 14, wherein said first set of process parameters comprises a first chamber etch pressure and said second set of process parameters comprises a second chamber etch pressure, which is lower than said first chamber etch pressure.

22. The method of claim 14 wherein said plasma processing chamber represents a plasma processing chamber in a high density plasma etch system.

23. The method of claim 22, wherein said high density plasma etch system represents a transformer coupled plasma etch system.

24. The method of claim 14, wherein the self-aligned contact opening has an aspect ratio greater than or equal to about 3:1.

25. The method of claim 14, wherein the self-aligned contact opening has a depth that is more than about 0.75 micron.

26. The method of claim 25, wherein the nitride layer is disposed at most about 5000 Angstroms above the substrate.

* * * * *